United States Patent
Okeshi et al.

[11] Patent Number: 6,005,330
[45] Date of Patent: *Dec. 21, 1999

[54] PIEZOELECTRIC COMPONENT AND METHOD OF PRODUCING SAME

[75] Inventors: Motoyuki Okeshi, Shiga-ken; Yasuo Otowaki, Kyoto; Koichi Nitta, Oumihachiman; Satoru Hachinohe, Yokaichi; Takashi Hashimoto; Makoto Irie, both of Toyama, all of Japan

[73] Assignee: Murata Manufacturing Co., Ltd., Kyoto, Japan

[*] Notice: This patent is subject to a terminal disclaimer.

[21] Appl. No.: 08/923,197

[22] Filed: Sep. 4, 1997

[30] Foreign Application Priority Data

Jan. 14, 1997 [JP] Japan ................................ 9-017565

[51] Int. Cl.⁶ .................................................. H01L 41/08
[52] U.S. Cl. ...................... 310/348; 310/367; 310/368; 310/344
[58] Field of Search .................................. 310/344, 348, 310/367, 368, 366

[56] References Cited

U.S. PATENT DOCUMENTS 5,699,027 12/1997 Tsuji et al. ......................... 310/348 X
5,821,665 10/1998 Onishi et al. ....................... 310/344 X
5,850,677 12/1998 Ryoichi ............................. 310/344 X
5,859,488 1/1999 Okeshi et al. ......................... 310/368

FOREIGN PATENT DOCUMENTS

0224515 9/1990 Japan ..................................... 310/348

Primary Examiner—Mark O. Budd
Attorney, Agent, or Firm—Graham & James LLP

[57] ABSTRACT

A piezoelectric component prevents development of a short circuit between separate electrodes of a piezoelectric element and provides a high level of connection reliability. The piezoelectric component includes a piezoelectric element utilizing a longitudinal oscillation mode and being mounted on a mounting substrate. The piezoelectric element has on one main surface thereof a first electrode and a second electrode formed by dividing electrode material via longitudinally extending linear grooves and, on the other main surface, a third electrode. Conductive support members are secured to node sections of the first and second electrodes so as to be spaced apart from each other with respect to the longitudinal dimension of the piezoelectric substrate. The support members are adhered to and secured to pattern electrodes of the mounting substrate by conductive adhesive.

7 Claims, 9 Drawing Sheets

FIG.1 ground electrode 7
1 Piezoelectric element
26 conductive wire
6c
25 conductive support member
24
conductive paste
22 pattern electrode
23
21 pattern electrode
20 mounting substrate

PIEZOELECTRIC COMPONENT AND METHOD OF PRODUCING SAME

BACKGROUND OF THE INVENTION

1. Field of the Invention

The present invention relates to a piezoelectric component utilizing a longitudinal oscillation mode for use in an AM filter or other electronic components.

2. Description of the Related Art

Conventionally, as shown in Japanese Patent Unexamined Publication No. 2-224515, a piezoelectric component is known in which a piezoelectric element utilizing a longitudinal oscillation mode is disposed in a case. In this piezoelectric element, a first main surface of the piezoelectric element is provided with input and output electrodes that are formed by dividing electrode material by forming a longitudinally extending linear groove in the electrode material disposed on an entire are of the first main surface, and a second main surface of the piezoelectric element is provided with a common electrode, wherein a part of each of the input and output electrodes is provided with a separate, independent support section formed of an isotropic elastic conductive material and constitutes an electrical contact section to be electrically connected with an external conductor. The above-mentioned support sections are arranged on either side of the groove and disposed to extend along the longitudinal dimension of the input and output electrodes. By pressurizing the piezoelectric element via a spring member, the above-mentioned support sections are elastically biased into contact with input and output terminals fixed to the case to achieve conduction through contact.

In the above-described piezoelectric element, the distance between the support members which are spaced apart from each other is small. Thus, when the piezoelectric element as described above is connected to external conductors, such as terminals fixed to a case, it is necessary for the external conductors to be disposed in close proximity to each other. Thus, if there is a small positional deviation of the piezoelectric element, a short circuit may be developed between the input and output electrodes.

In the above-described piezoelectric component, the elastic support sections thereof are connected to terminals of a case by bringing support sections into elastically biased contact with the terminals. In effecting this connection, the piezoelectric element is liable to undergo positional deviation if vibrations or the like are applied to the piezoelectric element. In view of this, to enhance the force for holding the piezoelectric element in position and achieving the conductivity thereof, support sections may be connected and fixed to pattern electrodes of a mounting substrate or the like by using a conductive adhesive or the like. In this case, due to the small distance between the support sections of the input and output electrodes, a short circuit may be developed between the input and output electrodes if the conductive adhesive is spread only a small amount, resulting in a deterioration in reliability in the necessary electrical connection.

SUMMARY OF THE INVENTION

The preferred embodiments of the present invention provide a piezoelectric component in which a piezoelectric element utilizing a longitudinal oscillation mode is mounted on pattern electrode of a mounting substrate, wherein a short circuit is prevented from being developed between the separate electrodes of the piezoelectric element, thereby achieving an improvement in terms of reliability of electrical connection.

In accordance with the preferred embodiments of the present invention, a piezoelectric component in which a piezoelectric element utilizing longitudinal oscillation mode is mounted on pattern electrodes disposed on an upper surface of an insulating mounting substrate, wherein the piezoelectric element has on a first main surface thereof first and second electrodes divided by a longitudinally extending linear groove, wherein a third electrode is provided on the other main surface thereof, conductive support members being fixed to node portions of the first and second electrodes so as to be spaced apart from each other with respect to the longitudinal dimension, and wherein the first main surface of the piezoelectric element having the first and second electrodes faces the surface of the mounting substrate on which the pattern electrodes are provided, the support members being connected and secured to the pattern electrodes of the mounting substrate.

When the first and second electrodes of the piezoelectric element are connected to the pattern electrodes of the mounting substrate, it is possible for the pattern electrodes to be longitudinally spaced apart from each other since the support members fixed to the electrodes are provided so as to be spaced apart from each other with respect to the longitudinal dimension. Thus, a short circuit will not be developed between the first and second electrodes even when the piezoelectric element undergoes positional deviation.

The support members are preferably provided at the node portion of the piezoelectric element, that is, substantially in the middle portion with respect to the longitudinal dimension thereof. In the preferred embodiments of the present invention, the node portion includes not only a completely non-oscillating portion but also a range which will involve no problem in terms of oscillation characteristics even when this portion is constrained. Since it is desirable for the support members on the first and second electrodes to be spaced as far apart from each other as possible with respect to the longitudinal dimension, it is desirable for the support members to be fixed to positions near an interface between the node portion and the non-node portion. Generally speaking, in the case of a longitudinal oscillation mode element, the node range is approximately ¼ of the length of the element, so that it is possible for the support members to be spaced apart from each other by this desired distance.

There are various methods of connecting the support members to the pattern electrodes. For example, the support members may be formed of a conductive adhesive, metal bumps or the like, and glued to the pattern electrodes by a conductive adhesive or the like. When the support members are formed of an uncured conductive adhesive, they can be directly joined to the pattern electrodes. To enhance the adhesive strength between the piezoelectric element and the mounting substrate, it is possible to use an insulating adhesive in addition to the conductive adhesive. This insulating adhesive is preferably used in those portions of the piezoelectric element which belong to the node portion thereof and exclude the conductive support sections.

When two grooves are provided on one main surface of the piezoelectric element to form three electrodes by dividing the electrode material by forming grooves therein, it is desirable for the conductive support member fixed to the first, central electrode, obtained through division by the grooves, and the conductive support members fixed to the second electrodes on either side of the first electrode to be arranged in a zigzag pattern.

When the piezoelectric element is attached to the mounting substrate, the following problem may be involved. That is, if the piezoelectric element is attached in an inclined state, there is a concern that either of the first and second electrodes will be brought into contact with pattern electrodes of different electric potentials to thereby degenerate the oscillation characteristics. However, when the support members are arranged in a zigzag pattern as described above, a three-point support structure is obtained, so that horizontally is easily attained, thereby achieving an improvement in terms of stability.

Apart from the conductive support members, it is desirable to fix insulating support members to the node portions of the first and second electrodes. In this case, a plurality of support members are preferably provided for one electrode, or the support member has a large length, so that, when the piezoelectric element is attached to the mounting substrate by the support members, the support area is increased, thereby achieving an improvement in terms of stability. It can happen that the conductive support members are brought into close proximity to the insulating support members with respect to the width dimension of the element. Even in that case, a short circuit can not be developed.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
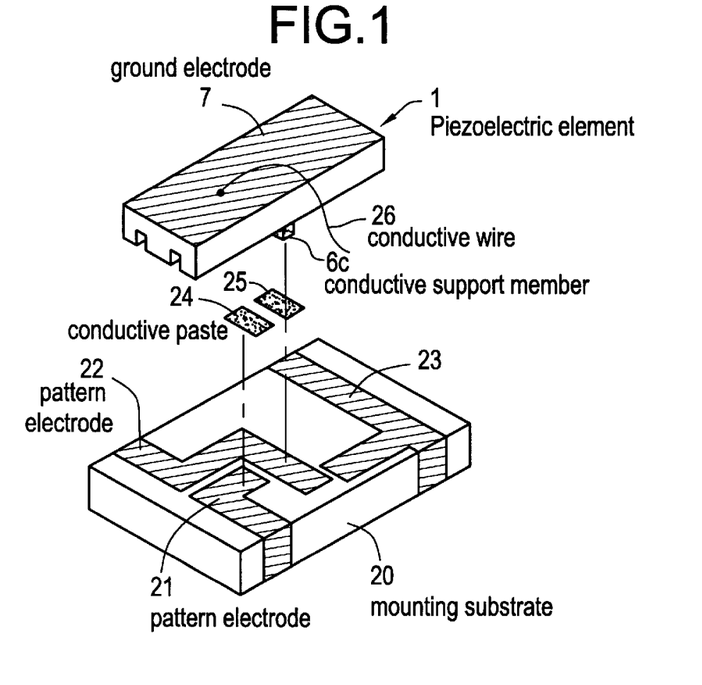
FIG. 1 is an exploded perspective view of a piezoelectric component according to a first preferred embodiment of the present invention.
Figure 2:
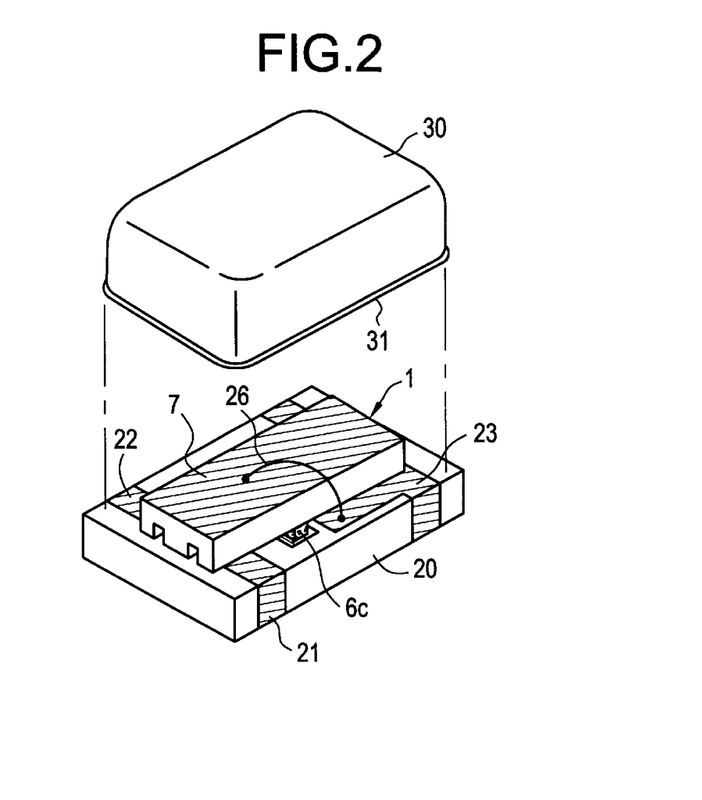
FIG. 2 is an exploded perspective view of the cap and the mounting substrate of the piezoelectric component shown in FIG. 1.

FIGS. 1 and 2 show a piezoelectric AM filter of a surface mounting type constituting an example of the piezoelectric component of a preferred embodiment of the present invention. This piezoelectric filter is composed of a mounting substrate 20, a piezoelectric element 1 and a cap 30.

The mounting substrate 20 preferably is a substantially rectangular insulating thin plate preferably formed of alumina ceramics, glass ceramic, glass epoxy resin or other suitable material. As shown in FIG. 1, on the upper surface of the mounting substrate 20, three pattern electrodes 21, 22 and 23 on the input side, the output side and the ground side are formed by a well-known method, such as sputtering, evaporation or printing. The pattern electrodes 21, 22 and 23 preferably extend around the side edges of the mounting substrate 20 to the back surface thereof. Conductive paste 24, 25 is applied to the inner end portions of the pattern electrodes 21 and 22 on the input and output sides by screen printing or the like.

Figure 3:
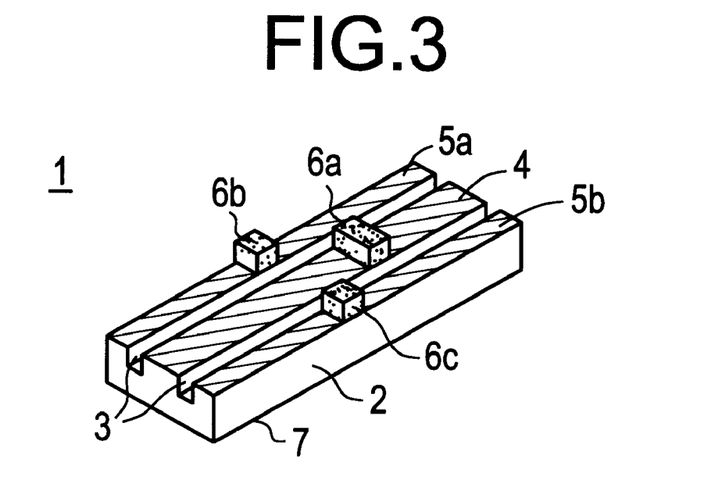
FIG. 3 is a perspective view of the piezoelectric element mounted on the piezoelectric component shown in FIG. 1.

The piezoelectric element 1 utilizes a longitudinal oscillation, and is equipped with a slim substantially rectangular piezoelectric ceramic substrate 2. On one main surface of this piezoelectric substrate 2, there are provided three electrodes 4, 5a and 5b defined by forming two linear grooves 3 extending along the longitudinal dimension to divide the electrode material as shown in FIG. 3. Of these electrodes, the central, relatively wide electrode 4 preferably constitutes the input electrode, and the relatively narrow electrodes 5a and 5b on either side of the input electrode are the output electrodes. The width of the input electrode 4 is preferably approximately double a width of each of the output electrodes 5a and 5b. It is also possible for the central electrode 4 to be the output electrode and for the electrodes 5a and 5b on either side thereof to be the input electrodes. A common electrode (ground electrode) 7 is disposed to preferably cover the entire other main surface of the piezoelectric substrate 2.

Figure 4:
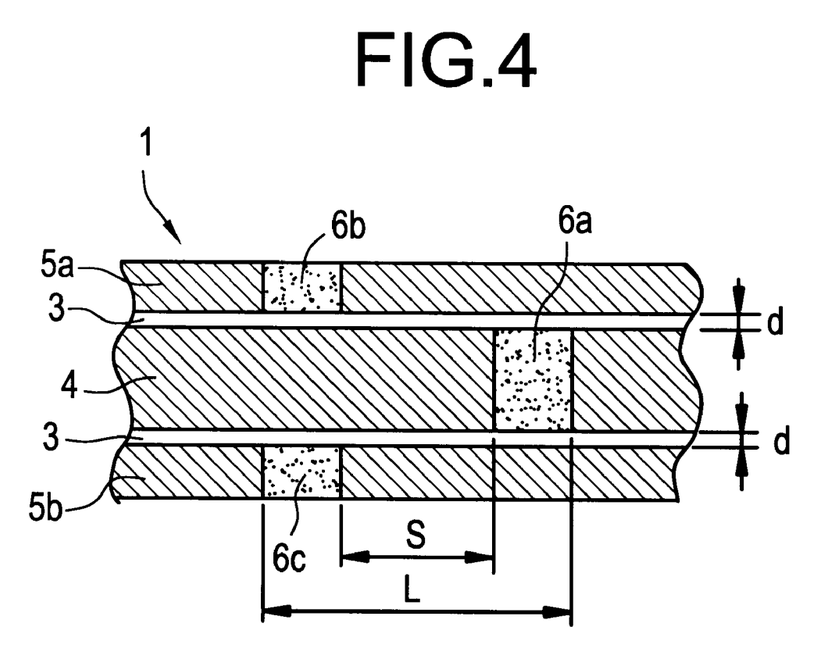
FIG. 4 is an enlarged perspective view of the node portion of the piezoelectric element shown in FIG. 3.

Conductive support members 6a, 6b and 6c are fixed to those sections of the element 1 which are on the input electrode 4 and the output electrodes 5a and 5b and which are preferably located at the ends of the node portion of the element 1, and the support members 6a, 6b and 6c are generally arranged in a zigzag pattern. The support members 6a, 6b and 6c of this preferred embodiment are formed preferably by applying a conductive paste to the electrodes 4, 5a and 5b so as to have a thickness, for example, of approximately 100 μm and curing it. It is also possible to form the electrodes 4, 5a and 5b as solder bumps, gold bumps or the like. As shown in FIG. 4, the support members 6b and 6c on the output electrodes 5a and 5b are preferably located at the same position with respect to the longitudinal dimension, and the support member 6a on the input electrode 4 is preferably located at a position spaced apart from the support members 6b and 6c by a minimum distance of S along the longitudinal dimension. This distance S is preferably set to be larger than the width d of the grooves 3. The maximum distance L between the support member 6a and the support members 6b and 6c is substantially the same as the length of the node range (for example, approximately ¼ of the element length). The widths of the support members 6a, 6b and 6c, fixed to the electrodes 4, 5a and 5b, are preferably the same as the widths of the electrodes 4, 5a and 5b, respectively.

The above piezoelectric element 1 is mounted on the mounting substrate 20 such that the side on which the input and output electrodes 4, 5a and 5b are located faces the upper surface of the mounting substrate 20. That is, the support member 6a on the input electrode 4 is adhered to the input-side pattern electrode 21, and the support members 6b and 6c on the output electrodes 5a and 5b are adhered to the output-side pattern electrode 22 preferably by the conductive paste 24, 25. The height of the support members 6a, 6b and 6c is preferably as small as, for example, approximately 100 μm, resulting in a slight inclination of the piezoelectric element 1 at an end portion of the piezoelectric element 1. This slight inclination would usually cause the piezoelectric element to come into contact with the upper surface of the mounting substrate 20 to thereby interfere with the oscillation characteristics, or might cause the output electrodes 4, 5a and 5b to come into contact with the pattern electrodes 21 through 23 of different electric potentials to thereby cause defective connection. However, since the piezoelectric element 1 is stably supported by the three support members 6a, 6b and 6c, the element has excellent horizontal stability and prevents interference with the oscillation characteristics of the piezoelectric element 1 and defective connection between the piezoelectric element 1 and the mounting substrate.

After adhering the piezoelectric element 1, the common electrode 7 of the piezoelectric element 1 and the ground side pattern electrode 23 are connected to each other by a conductive wire 26, as shown in FIG. 2. This connection by the wire 26 can be easily effected by a well-known wire bonding method.

After the wire connection, a cap 30 for covering the piezoelectric element 1 is adhered to the mounting substrate 20 to thereby seal the periphery of the piezoelectric element 1. A sealing adhesive 31 is preferably applied to the entire periphery of the opening of the cap 30 by a method such as transferring. After the cap 30 has been glued to the mounting substrate 20, the sealing adhesive 31 is cured, whereby the cap 30 is secured to the substrate. The cap 30 may be formed of an insulating material, such as alumina ceramics, or a metal, such as aluminum. Simultaneously with the curing of the sealing adhesive 31, the conductive paste 24, 25 may be cured.

Figure 5:
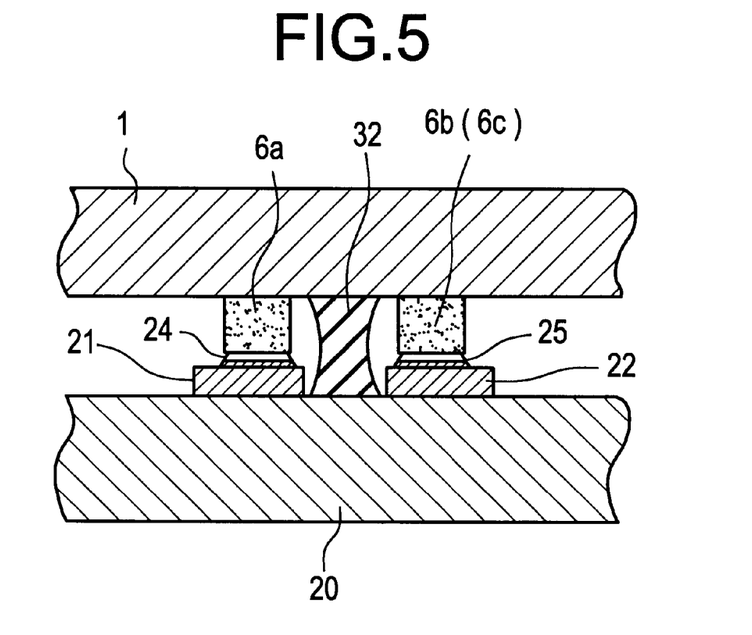
FIG. 5 is a diagram showing another connection structure for the piezoelectric element and the mounting substrate.

While in the above-described preferred embodiment, the piezoelectric element 1 is described as being adhered to the mounting substrate 20 by using the conductive paste 24, 25 alone, it is also possible to use an insulating adhesive 32 for element fixation in addition to the conductive paste 24, 25. In this case, the insulating adhesive 32 is applied to the section between the input side electrode 21 and the output side electrode 22, and the insulating adhesive 32 is caused to adhere between the support members 6a through 6c when gluing the piezoelectric element 1 to the mounting substrate 1, whereby the piezoelectric element 1 can be firmly secured to the substrate.

As described above, when both the conductive adhesive 24, 25 and the insulating adhesive 32 are used, the conductive adhesive 24, 25 is used mainly for the purpose of effecting electrical conduction of the conductive portions 36a through 38a of the support members 36 through 38 and the pattern electrodes 21 and 22, and the insulating adhesive 32 is used for the purpose of mechanically fixing the mounting substrate 20 and the piezoelectric element 30 to each other, so that the adhesives play their respective roles, whereby a mounting structure can be obtained which is equipped with both electrical conductivity and mechanical holding force.

Figure 6:
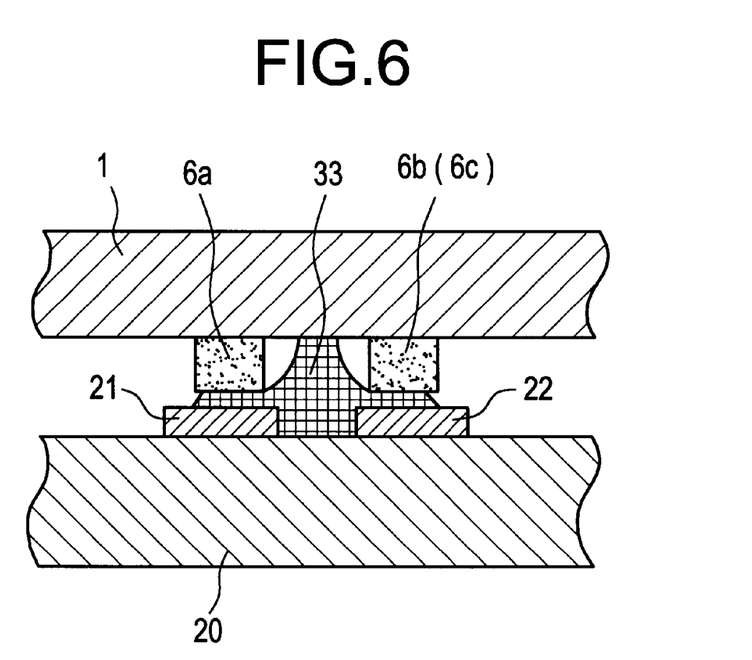
FIG. 6 is a diagram showing still another connection structure for the piezoelectric element and the mounting substrate.

Further, as shown in FIG. 6, it is also possible to glue the piezoelectric element 1 and the mounting substrate 20 to each other by using an anisotropic conductive adhesive 33. As is well known, the anisotropic conductive adhesive 33 conducts only in opposite directions, so that it conducts only between the opposite support members 6a through 6c and the pattern electrodes 21 and 22. In this case, no problem is caused if the anisotropic conductive adhesive 33 is spread to locations other than the opposite sections of the support members 6a through 6c and the pattern electrodes 21 and 22. Therefore, the anisotropic conductive adhesive 33 can be applied to a wide region between the piezoelectric element 1 and the mounting substrate 20. However, it is not desirable to apply the anisotropic conductive adhesive 33 beyond the node portion.

Figure 7:
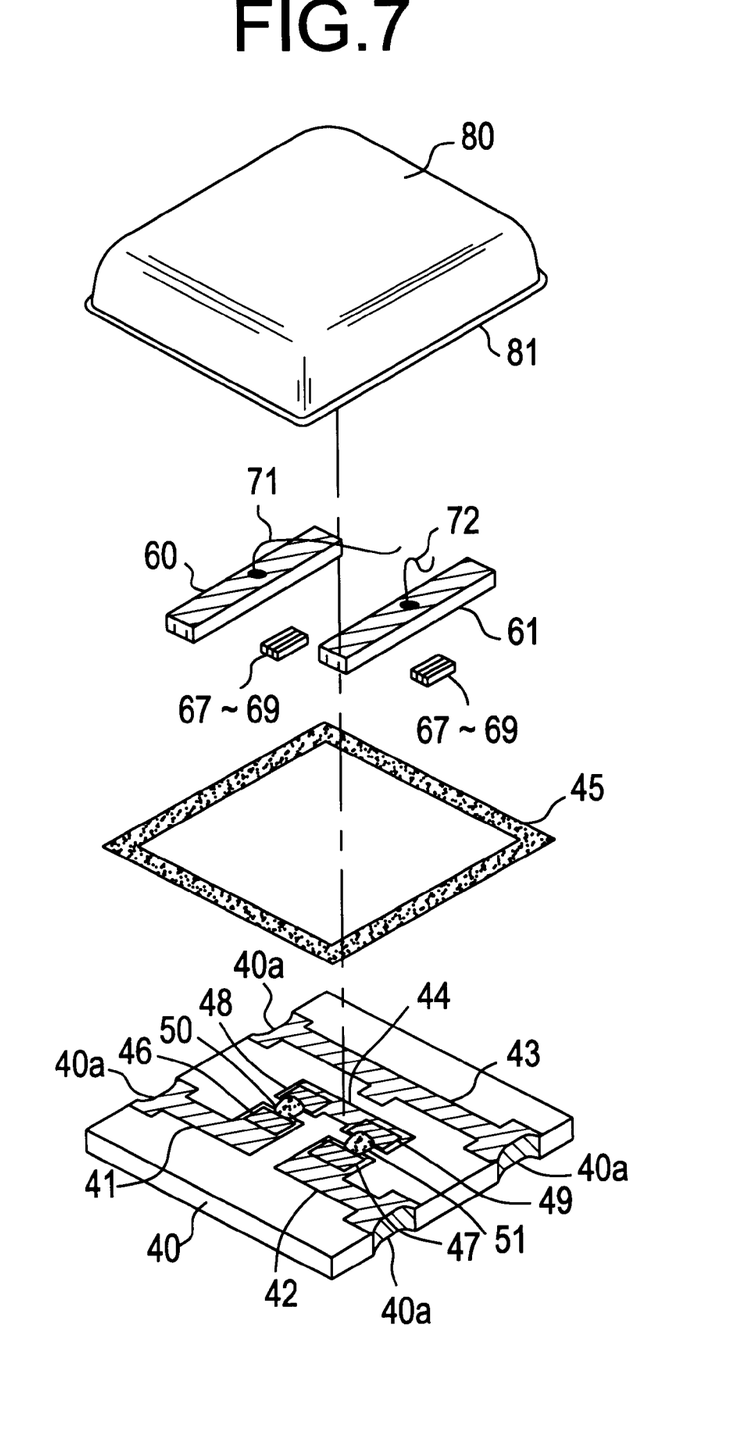
FIG. 7 is an exploded perspective view of a piezoelectric component according to a second preferred embodiment of the present invention.

FIG. 7 shows a second preferred embodiment of the present invention, which is in the form of a surface mounting type piezoelectric AM filter including two piezoelectric elements 60 and 61.

Disposed on a substrate 40 are an input side pattern electrode 41, an output side pattern electrode 42, a ground side pattern electrode 43 and an intermediate electrode 44. The input, output and ground side pattern electrodes 41 through 43 extend to the back side or bottom surface by way of groove portions 40a formed on edges of the substrate 40. A frame type insulating layer 45 is located at the section of the substrate 40 to which a cap is adhered.

Figure 8A:
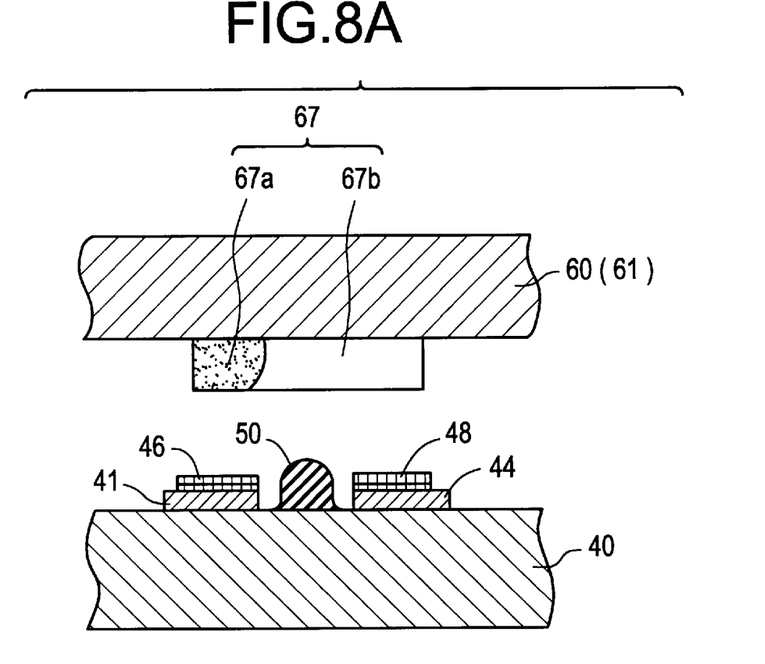
FIG. 8 is an enlarged view showing how the piezoelectric element is mounted on a mounting substrate.

As shown in FIG. 8(A), conductive paste 46, 47, 48, 49 is applied two-dimensionally to the element mounting sections of the input side and output side pattern electrodes 41 and 42 and the intermediate electrode 44 by screen printing or the like. Further, an insulating adhesive 50, 51 for holding piezoelectric elements 60, 61 are applied in a drop-like manner to the section between the input side pattern electrode 41 and the intermediate electrode 44 and to the section between the output side pattern electrode 42 and the intermediate electrode 44 by pin transfer, dispensation, etc. It is desirable for the thickness of the insulating adhesive portions 50 and 51 to be larger than the sum of the thickness of the pattern electrodes 41, 42 and 44 and the thickness of the conductive electrode portions 46 through 49.

Figure 9:
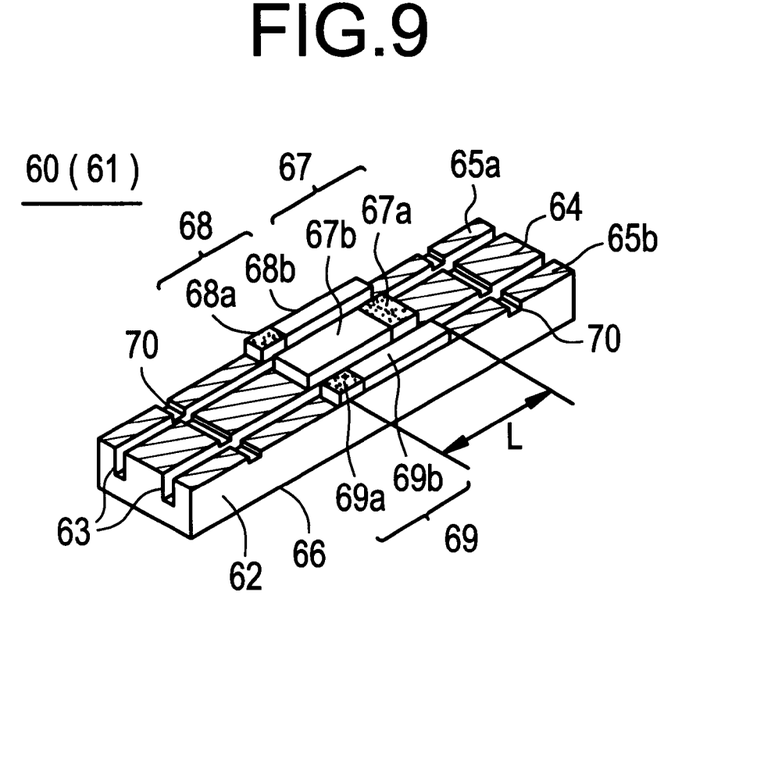
FIG. 9 is a perspective view of a piezoelectric element used in the piezoelectric component shown in FIG. 7.

Each of the two piezoelectric elements 60 and 61 preferably utilizes a longitudinal oscillation mode, and includes a slim substantially rectangular piezoelectric substrate 62, as shown in FIG. 9. On one main surface of this piezoelectric substrate 62, three electrodes 64, 65a and 65b are formed by dividing electrode material via two grooves 63. The central, relatively wide electrode 64 is the input electrode, and the relatively narrow electrodes 65a and 65b on either side thereof are the output electrodes. On the other main surface of the piezoelectric substrate 62, a common electrode 66 is disposed.

Longitudinally extending support members 67 through 69 are fixed to those sections of the element 60, 61 which are located on the input electrode 64 and the output electrodes 65a and 65b and which belong to the node portion of the element 60, 61 so as to be arranged substantially in parallel and at the same position with respect to the longitudinal dimension of the element. The support members 67 through 69 of this preferred embodiment are preferably composed of conductive portions 67a through 69a and insulating portions 67b through 69b. The conductive portion 67a on the input electrode 64 and the conductive portions 68a and 69a on the output electrodes 65a and 65b are preferably located on the opposite end portions of the support members 67 through 69. Thus, the conductive portions 67a through 69a are preferably spaced apart from each other with respect to the longitudinal dimension of the element and arranged in a zigzag pattern. In this preferred embodiment, the support members 67 through 69 are preferably formed so as to cover an entire area of the node region of the piezoelectric element 60, 61, and the length L of the support members is set to be approximately ¼ of the entire length of the piezoelectric element 60, 61.

In the vicinity of the end portions of the input and output electrodes 64, 65a and 65b of the piezoelectric element 60, 61, grooves 70 for spurious reduction are formed so as to extend along the width dimension.

Figure 8B:
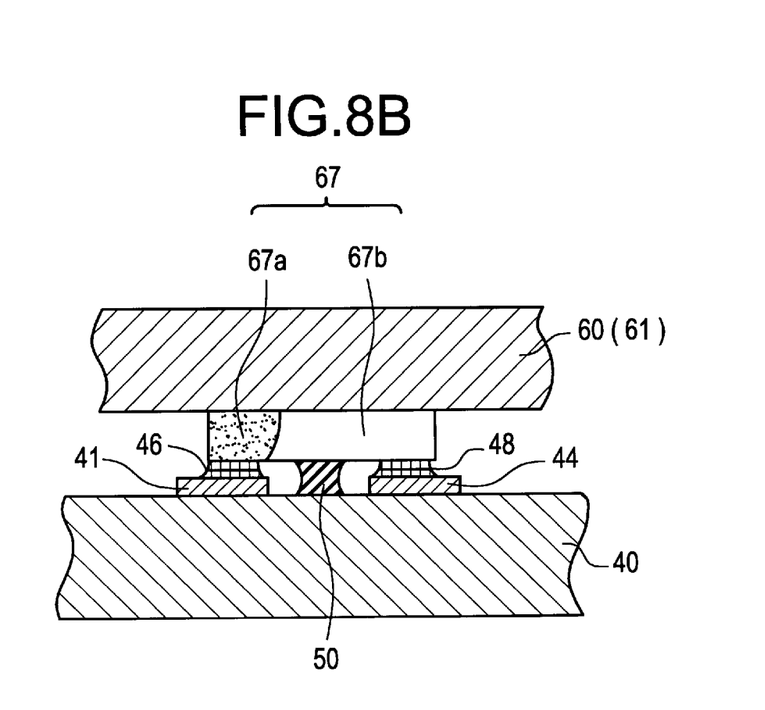

The piezoelectric element 60, 61 is mounted such that the side thereof on which the input and output electrodes are disposed faces the upper surface of the mounting substrate 40. That is, with respect to one piezoelectric element 60, the conductive portion 67a of the support member 67 on the input electrode 64 is connected to the input side pattern electrode 41 by conductive paste 46, and the conductive portions 68a and 69a of the support members 68 and 69 on the output electrodes 65a and 65b are connected to the intermediate electrode 44 by conductive paste 48. Regarding the other piezoelectric element 61, the conductive portion 67a of the support member 67 on the input electrode 64 is connected to the intermediate electrode 44 by conductive paste 49, and the conductive portions 68a and 69a of the support members 68 and 69 on the output electrodes 65a and 65b are connected to the output side pattern electrode 42 by conductive paste 47. Thus, the two piezoelectric elements 60 and 61 are cascade-connected between the input side electrode 41 and the output side electrode 42. When the piezoelectric elements 60 and 61 are mounted to the mounting substrate 40, an insulating adhesive 50, 51 applied to the section between the input side pattern electrode 41 and the intermediate electrode 44 and to the section between the output side pattern electrode 42 and the intermediate electrode 44 causes the mounting substrate 40 to be firmly adhered to the insulating portions 67b through 69b of the support members 67 through 69, whereby the piezoelectric elements 60 and 61 are secured in position horizontally and in a stable manner.

After the piezoelectric elements 60 and 61 have been secured to the mounting substrate 40, the common electrodes 66 of the piezoelectric elements 60 and 61 are connected to the ground side pattern electrode 43 of the mounting substrate 40 by wires 71 and 72, respectively.

A cap 80 is formed of metal having a size large enough to cover the two elements 60 and 61 simultaneously, and a sealing adhesive 81 is applied to the entire periphery of the opening of the cap. When the cap 80 is pressed against the substrate 40, the opening of the cap 80 is glued to the insulating layer 45. In this condition, the sealing adhesive 81 and the conductive adhesive portions 46 through 49 are cured substantially at the same time, whereby the sealing of the interior of the cap 80 and the electrical connection thereof are completed, thereby providing a piezoelectric filter.

Figure 10:
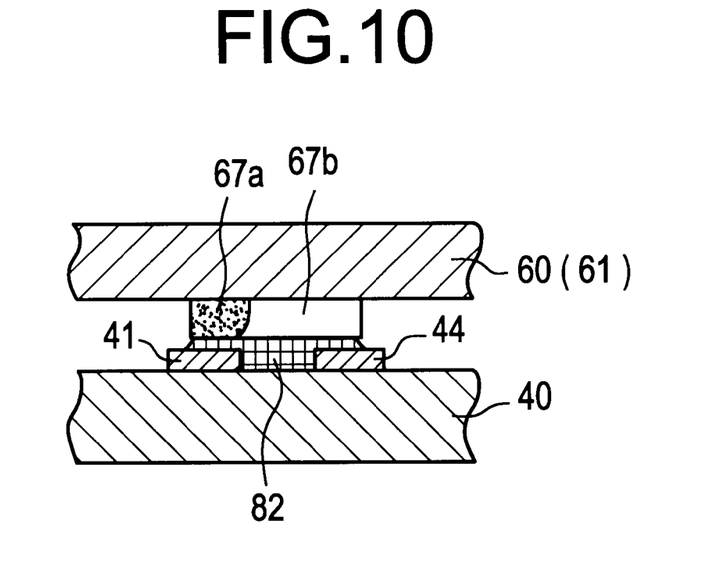
FIG. 10 is an enlarged view showing another method of mounting the piezoelectric element shown in FIG. 7 on the mounting substrate.

While in the above-described preferred embodiment both conductive adhesive 46–49 and holding adhesive 50, 51 are used when connecting the support members 67 through 69 of the elements 60 and 61 to the mounting substrate 40, it is also possible, instead, to use an anisotropic conductive adhesive 82, as shown in FIG. 10. In this case, the anisotropic conductive adhesive 82 can be applied not only to the opposing sections of the support members 67 through 69 and the pattern electrodes 41, 42 and 44, but also widely to other portions, so that the elements 60 and 61 can be secured to the mounting substrate 40 in a stable manner, and a high level of reliability in conductivity can be achieved.

Figure 11:
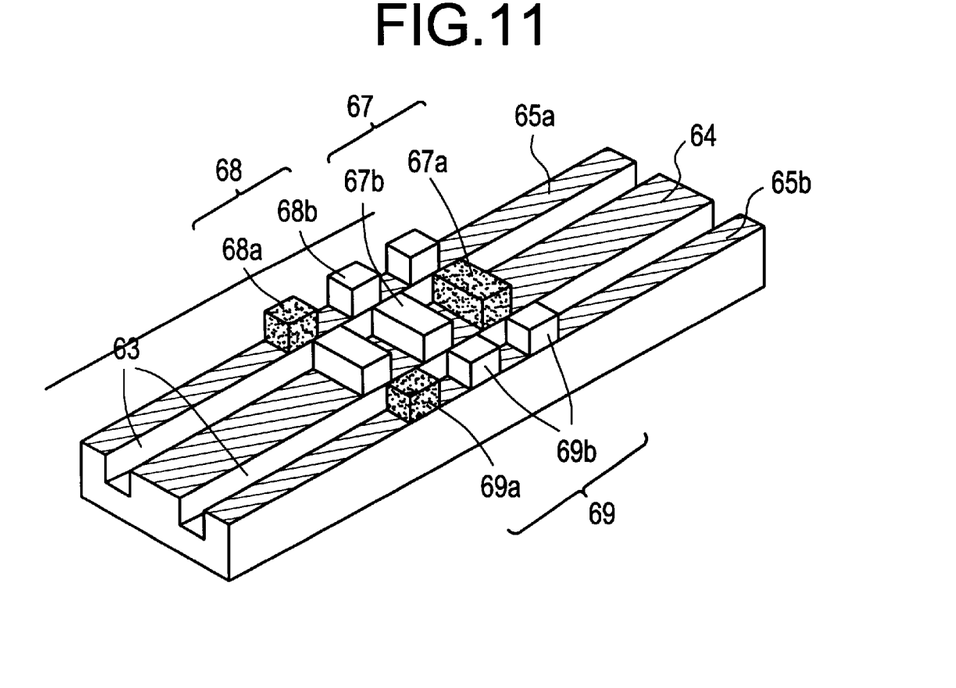
FIG. 11 is a perspective view of another example of the piezoelectric element.
Figure 12:
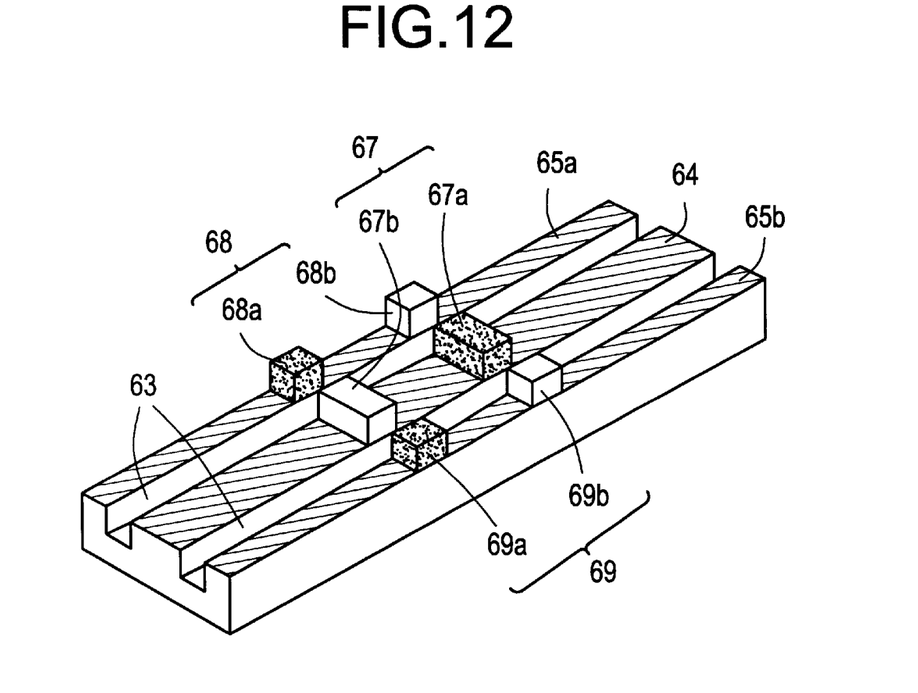
FIG. 12 is a perspective view of still another example of the piezoelectric element.

When providing support members 67 through 69 having conductive and insulating portions, there is no need to form them so as to extend continuously in the longitudinal dimension, and it is possible for the conductive portions 67a through 69a and the insulating portions 67b through 69b to be separated from each other, as shown in FIGS. 11 and 12. The conductive portions 67a through 69a are preferably spaced apart from each other with respect to the longitudinal dimension of the element and arranged in a zigzag pattern. While in this example those sections of the electrodes 64, 65a and 65b which are between the conductive portions 67a through 69a and the insulating portions 67b through 69b are exposed, it is also possible for the sections to be covered by a thin support member.

Figure 13:
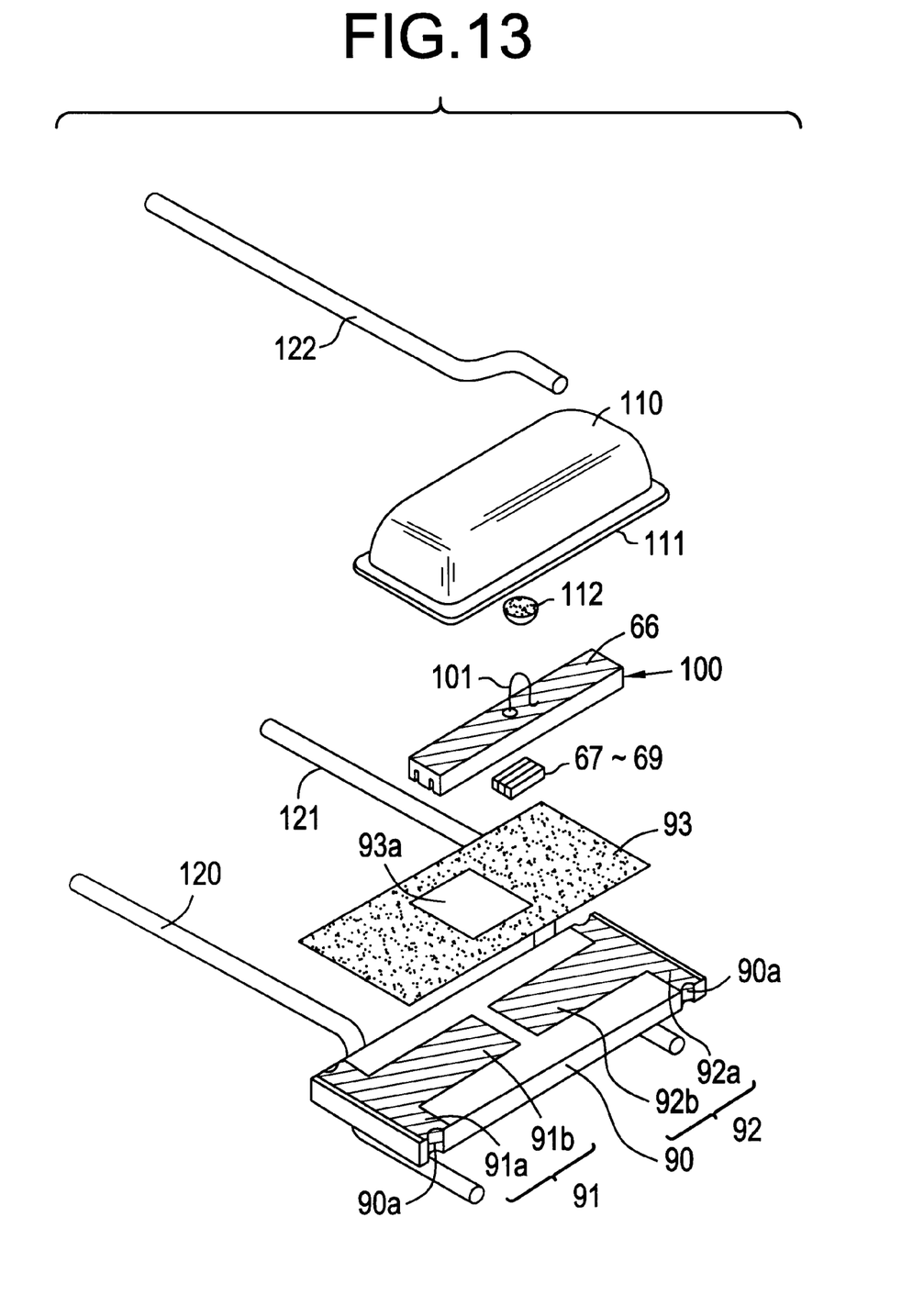
FIG. 13 is an exploded perspective view of a piezoelectric component according to a third preferred embodiment of the present invention.

FIG. 13 shows a lead terminal type piezoelectric AM filter according to the third preferred embodiment of the present invention. This piezoelectric filter is equipped with a mounting substrate 90, a piezoelectric element 100, a metal cap 110 and lead terminals 120 through 122.

The mounting substrate 90 preferably includes a substantially rectangular insulating thin plate formed of alumina ceramics, glass ceramic, glass epoxy resin or the like. On the upper surface of the mounting substrate 90, input and output pattern electrodes 91 and 92 are formed by a well-known method, such as sputtering, evaporation or printing. The pattern electrodes 91 and 92 are preferably formed substantially symmetrically, and external connection sections 91a and 92a are arranged along the shorter sides of the mounting substrate 90 so as to extend to the back side or rear surface by way of groove portions 90a formed at both ends of the mounting substrate 90. Internal connection sections 91a and 92a extend from the external connection sections 91b and 92b toward the central portion of the mounting substrate 90.

On the upper surface of the mounting substrate 90, an insulating layer 93, such as an insulating resist pattern, is formed by screen printing or the like so as to cover part of the pattern electrodes 91 and 92. The internal connection sections 91b and 92b of the pattern electrodes 91 and 92 are exposed through a central opening portion 93a of the insulating layer 93. This insulating layer 93 is provided for the purpose of preventing a short circuit from being developed between the pattern electrodes 91 and 92 of the mounting substrate and the metal cap 110, mitigating the surface irregularities of the surface of the mounting substrate 90 caused by the thickness of the pattern electrodes 91 and 92, and preventing defective sealing of the cap 110.

The piezoelectric element 100 is a piezoelectric filter element utilizing a longitudinal oscillation mode and preferably has the same configuration as that of the piezoelectric elements 60 and 61 shown in FIG. 9, so that the components which are the same as those of the piezoelectric elements 60 and 61 will be indicated by the same reference numerals, and a description of such components will be omitted. As in the case of FIG. 9, support members 67 through 69 having conductive portions and insulating portions are secured to the input and output electrodes 64, 65a and 65b of the piezoelectric element 100.

A conductive wire 101 preferably comprising gold or the like is secured to a central portion constituting the node portion of the common electrode 66 of the piezoelectric element 100 by wire bonding. While the wire 101 in this example is an Au wire having a diameter of about 30 μm, any other type of wire will surface as long as the wire has conductivity, elasticity and weather resistance. Wire bonding involves primary and secondary sides. From the viewpoint of an improvement in the elasticity of the wire 101 and reliability in conduction, both the primary and secondary sides are mounted to the common electrode 66, and the section therebetween is in the form of a loop. The height of the loop may be arbitrarily selected. However, taking into account the variation in the mounting of the element 100, the variation in the size of the cap 110, etc., it is preferable to design it such that the wire 101 is reliably pressed against the inner top side of the cap 110.

The metal 110 for covering the element 100 is glued to the mounting substrate 90 for sealing. On the opening of the cap 110, an adhesive 111 for sealing is applied beforehand to a substantially uniform thickness by transfer or the like. Further, on the portion of the inner top side of the cap 110, in particular, on the portion opposite to the wire 101 of the piezoelectric element 100, a conductive adhesive 112 is applied by dispensation, pin transfer or the like. The application amount, i.e., the thickness, of the conductive adhesive 112 must be adjusted such that, when the cap 110 is glued to the mounting substrate 90, the conductive adhesive 112 adheres to the wire 101 but not to the piezoelectric element 100. By covering the mounting substrate 90 with the cap 110, the opening of the cap 110 is brought into close contact with the insulating layer 93 of the mounting substrate 90, whereby the interior of the cap 110 is sealed. Further, when the mounting substrate 90 is covered with the cap 110, the wire 101 is brought into press contact with the inner side of the cap 110 and digs into the conductive adhesive 112 and is crushed. When, in this condition, heating is effected at a predetermined temperature and for a predetermined period of time, the sealing adhesive 111 and the conductive adhesive 112 are cured substantially at the same time, whereby the cap 110 is adhered to the mounting substrate 90 for sealing, and the common electrode 66 of the element 100 is electrically connected to the cap 110. Since the conductive adhesive 112 is spaced apart from the piezoelectric element 100, the heat of the cap 110 at the time of heat treatment is not directly conducted to the piezoelectric element 100, so that it is possible, for example, to mitigate the influence of the heat on the piezoelectric element 100.

Input and output lead terminals 120 and 121 are connected to the external connection sections 91a and 92a of the pattern electrodes 91 and 92 extending to the back side or rear surface of the mounting substrate 90 by soldering or the like, whereby it is possible to prevent the input and output lead terminals 120 and 121 from being brought into close proximity to the cap 110. A grounding lead terminal 122 is joined to the outer surface of the cap 110 by soldering, welding or the like. It is possible for the grounding lead terminal 122 to be joined to the cap 110 before the cap 110 is glued to the mounting substrate 90.

Figure 14:
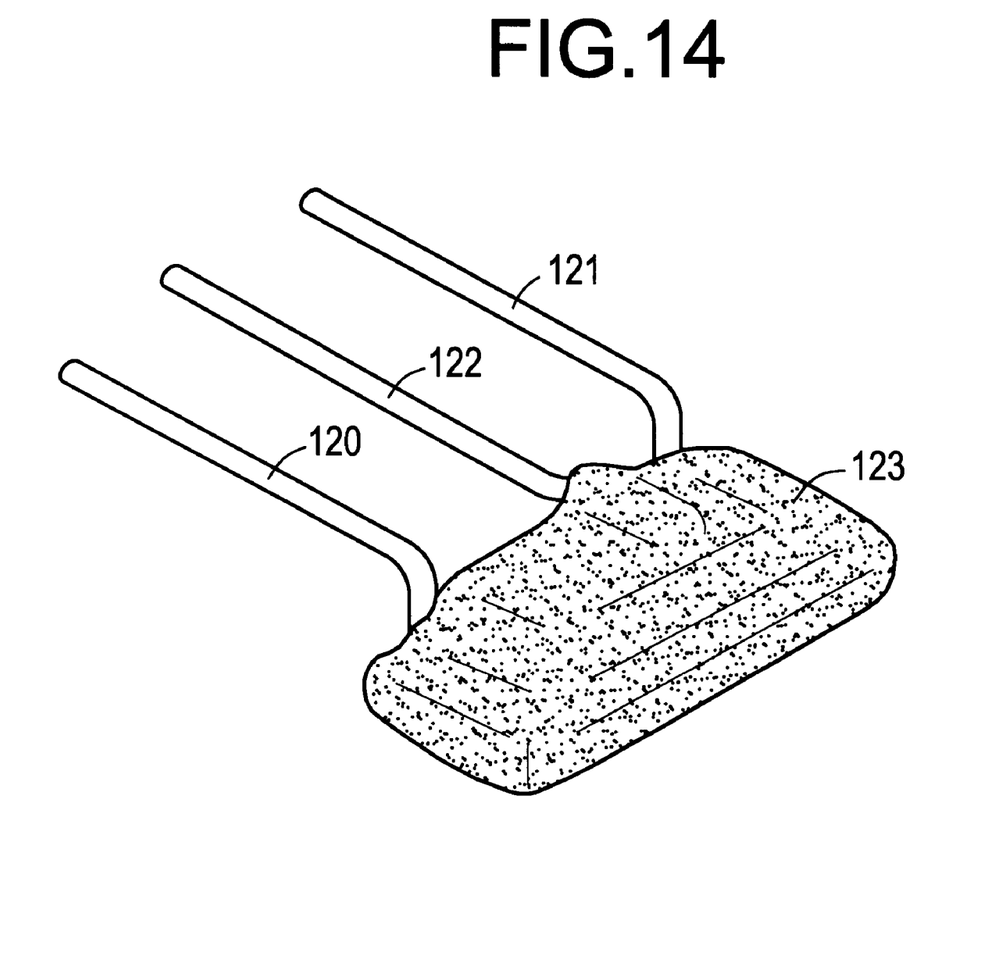
FIG. 14 is a perspective view showing the piezoelectric component of FIG. 13 in the completed state.

After the lead terminals 120 through 122 have been connected, the periphery of the mounting substrate 90 and the cap 110 is covered with an outer coating 123 to thereby provide a completed product.

In the case of the piezoelectric component of the above-described preferred embodiment, the ground side common electrode 66 of the piezoelectric element 100 is electrically connected to the cap 110 through the wire 101, and the cap 110 is electrically connected to the grounding lead terminal 122, so that there is no need to form a grounding electrode on the mounting substrate 90, whereby it is possible to reduce the size of the mounting substrate 90 and the connection process can be facilitated. Further, since there is no need to connect the common electrode 66 of the piezoelectric element 100 to the grounding electrode of the mounting substrate by a wire, it is possible to eliminate the problems attributable to the difference between the heights of their connection points, making it possible to prevent the wire from falling or being broken and avoid an increase in the size of the cap.

The present invention is not restricted to the above preferred embodiments.

While in the above preferred embodiments described above, the input and output electrodes of the piezoelectric element are formed by dividing electrode material into three sections via grooves, it is also possible for the electrodes to be formed by dividing electrode material into two sections via one groove. In this case, the support members secured to the electrodes are not arranged in a zigzag pattern, but positioned so as to be shifted from each other with respect to the longitudinal dimension of the element.

Further, while in the above preferred embodiments, when the input and output electrodes of the piezoelectric element are formed through division of electrode material into three sections by two grooves, the width of the central electrode is larger than that of the electrodes on either side thereof, it is also possible for the electrodes to have the same width. However, when the width of the central electrode is larger than that of the electrodes on either side thereof as in the case of the above preferred embodiments, the width of the support member fixed to the central electrode is also relatively large, so that an improvement in stability is achieved in gluing the piezoelectric element to the mounting substrate or the like, thereby making it advantageously possible to reliably prevent inclination of the element with respect to the longitudinal dimension.

Instead of the piezoelectric element shown in FIG. 3, the piezoelectric element mounted on the piezoelectric component of the first preferred embodiment (FIG. 1) may be the piezoelectric element as shown in FIGS. 9, 11 or 12. Further, the piezoelectric element mounted on the piezoelectric component of the second and third preferred embodiments (FIGS. 7 and 13) may be the piezoelectric element as shown in FIGS. 3, 11 or 12.

As is apparent from the above description, in accordance with the preferred embodiments of the present invention, one main surface of a piezoelectric substrate is provided with first and second electrodes formed by dividing electrode material via linear grooves extending along the longitudinal dimension of the substrate, and conductive support members are secured to the node portions of the first and second electrodes so as to be spaced apart from each other with respect to the longitudinal dimension of the piezoelectric substrate, and the first and second electrodes of the piezoelectric element are connected to the pattern electrodes of a mounting substrate via intermediate support members, so that, even if the piezoelectric element is positionally deviated to some degree, there is no concern that a short circuit is developed between the first and second electrodes, thereby making it possible to obtain a piezoelectric component having a high level of connection reliability.

Further, since the support members are secured in position so as to be spaced apart from each other with respect to the longitudinal dimension of the piezoelectric substrate, the effect of preventing the piezoelectric element from being inclined with respect to the longitudinal dimension is enhanced when the piezoelectric element is mounted to external conductors, whereby it is possible to prevent or restrain the development of a short circuit or the hindrance to the oscillation as a result of the end portion of the piezoelectric element coming into contact with the mounting substrate, etc.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric component comprising:

a piezoelectric element having a first main surface and a second main surface;

a mounting substrate;

a plurality of pattern electrodes disposed on an upper surface of the mounting substrate, first, second and third electrodes disposed on the first main surface of the piezoelectric element and separated from each other by two grooves formed in the first main surface of the piezoelectric substrate;

a fourth electrode disposed on the second main surface of the piezoelectric substrate; and a first conductive support member disposed on the first electrode, a second conductive support member disposed on the second electrode and a third conductive support member disposed on the third electrode such that the first, second and third conductive support members are spaced apart from each other and arranged in a zigzag pattern; wherein the first main surface of the piezoelectric element having the first and second electrodes disposed thereon faces a surface of the mounting substrate on which the pattern electrodes are disposed and said support members are electrically connected and physically secured to the pattern electrodes disposed on the mounting substrate.

2. A piezoelectric component according to claim 1, wherein one of said three electrodes disposed on the first main surface of said piezoelectric element has a width that is greater than a width of each of the other two of said three electrodes.

3. A piezoelectric component according to claim 1, further comprising insulating support members secured to the first and second electrodes of said piezoelectric element to increase a physical bond between the first and second electrodes and the mounting substrate.

4. A piezoelectric component according to claim 3, wherein the insulating support members are connected to the respective first and second electrodes at locations corresponding to a vicinity of node portions of the piezoelectric element.

5. A piezoelectric component according to claim 1, wherein a cap for covering said piezoelectric element is adhered to said mounting substrate to thereby seal an interior of said cap.

6. A piezoelectric component according to claim 1, wherein the piezoelectric element vibrates in a longitudinal oscillation mode.

7. A piezoelectric component according to claim 1, wherein the conductive support members are connected to the respective first and second electrodes at locations corresponding to a vicinity of node portions of the piezoelectric element.

* * * * *